United States Patent [19]
Kiyokawa

[11] Patent Number: 5,920,192
[45] Date of Patent: Jul. 6, 1999

[54] INTEGRATED CIRCUIT TRANSPORTING APPARATUS INCLUDING A GUIDE WITH AN INTEGRATED CIRCUIT POSITIONING FUNCTION

[75] Inventor: Toshiyuki Kiyokawa, Kuki, Japan

[73] Assignee: Advantest Corporation, Tokyo, Japan

[21] Appl. No.: 08/663,682

[22] Filed: Jun. 14, 1996

[30] Foreign Application Priority Data

| Jul. 3, 1995 | [JP] | Japan | 7-167404 |
| Aug. 4, 1995 | [JP] | Japan | 7-199925 |

[51] Int. Cl.⁶ .................................................. G01R 1/04
[52] U.S. Cl. ............................................................ 324/158.1
[58] Field of Search ...................... 269/21; 324/754–764, 324/158.1

[56] References Cited

U.S. PATENT DOCUMENTS

| 4,875,279 | 10/1989 | Sakiadis | 29/470 |
| 5,151,651 | 9/1992 | Shibata | 324/754 |
| 5,172,049 | 12/1992 | Kiyokawa et al. | 324/760 |
| 5,177,434 | 1/1993 | Suzuki et al | 324/755 |
| 5,523,687 | 6/1996 | Mitsui | 324/158.1 |
| 5,596,282 | 1/1997 | Giddings et al. | 324/754 |

FOREIGN PATENT DOCUMENTS 39 12 590 A1  10/1990  Germany.

OTHER PUBLICATIONS

Search and Examiner Report in corresponding Singapore Patent Application No. 9610392–4 (Austrian Patent Office Search and Examination Report, for Patent Application 9610392–4, filed Jul. 31, 1996).

Translation of an Official Letter Dated 26th Nov. 1997 from the German Patent Office; Re: German Patent Application No. 196 26 611.4–33.

*Primary Examiner*—Josie Ballato
*Assistant Examiner*—Russell M. Kobert
*Attorney, Agent, or Firm*—Staas & Halsey

[57] ABSTRACT

A low cost IC transporting apparatus locates a semiconductor device at an accurate position, picks up the semiconductor device by suction, and transports the semiconductor device. A play is provided in a positioning recessed portion having upwardly inclined surfaces so that a semiconductor device fallen into the positioning recessed portion can move in a horizontal direction. A guide surrounds a device suction unit picking up by suction the semiconductor device fallen into the positioning recessed portion. The guide guides the device suction unit to pick up by suction the semiconductor device at a predetermined suction position. Downwardly projected ridged portions are provided on the lower end of the guide, each of which includes a shape conforming to a corresponding one of the upwardly inclined surfaces of the positioning recessed portion. The guide also includes flat portions provided at the base portion of the ridged portions thereof. The flat portions abut against an upper end surface of the positioning recessed portion when the ridged portions of the guide engage with the upwardly inclined surfaces of the positioning recessed portion without any play therebetween.

23 Claims, 6 Drawing Sheets

INTEGRATED CIRCUIT TRANSPORTING APPARATUS INCLUDING A GUIDE WITH AN INTEGRATED CIRCUIT POSITIONING FUNCTION

BACKGROUND OF THE INVENTION

1. Field of the Invention

The present invention relates to an integrated circuit (IC) transporting and handling or processing apparatus (commonly called an IC handler) used, for example, in an IC testing apparatus (commonly called an IC tester) for testing ICs.

2. Description of the Related Art

FIG. 1 shows a diagrammatical arrangement of a prior art IC handler referred to as a horizontal transporting system. A plurality of tray groups 2 are disposed along one side, namely, the lower side 1A in the drawing, of a frame 1 which serves as a base. Each tray in the tray groups 2 is loaded with ICs. Each of the tray groups 2A–2E consists of a stack of multiple trays loaded up in vertical direction. The leftmost tray group 2A in the drawing is positioned at a loader section. ICS undergoing a test (hereafter ICs to be tested) have been loaded on each tray in the tray group 2A at the loader section.

A carrier arm 3 picks up two ICs at a time, in this example, out of the uppermost tray of the tray group 2A which is a stack of trays and transports them onto a turntable 4 called "soak stage". On the turntable 4, in order to define the positions for receiving ICs, are formed positioning recessed portions 5 arranged along two concentric circular lines at intervals of a constant angle as shown in FIG. 2.

Each recessed portion 5 is of substantially square shape in plan and the four sides thereof are surrounded by upwardly inclined walls (surfaces). Every time the turntable 4 rotates by one pitch, two ICs are fallen into two respective recessed portions 5 one being arranged in the inner circular line and the other in the outer circular line.

A reference numeral 6 denotes a contact arm for transferring ICs conveyed by the turntable 4 to a testing section 7. The contact arm 6 is adapted to pick up two ICs at a time by suction out of the respective positioning recessed portions 5 on the turntable 4 and transports these ICs to the testing section 7. The contact arm 6 has three arms and performs the operation of sequentially transferring the ICs to the testing section 7 and the operation of sequentially transferring the tested ICs to a transfer arm 8 located at an exit side by rotation of the three arms.

Further, the IC handler is constructed such that the turntable 4, the contact arm 6, and the testing section 7 are placed in a constant temperature or thermostatic room (chamber) 9, and ICs to be tested are maintained at a predetermined temperature within this thermostatic chamber 9 and undergo a test therein.

ICs taken out from the thermostatic chamber 9 by the transfer arm 8 located at the exit side of the thermostatic chamber are sorted on the basis of the test results and stored in corresponding one of three tray groups 2C, 2D and 2E in this example located at an unloader section. For example, non-conforming or bad ICs (ICs having a defect or failure) are stored in a tray of the rightmost tray group 2E, conforming or good ICs (ICs having no defect or failure) are stored in a tray of the tray group 2D positioned at the left side of the tray group 2E, and ICs which are needed to undergo a retest are stored in a tray of the tray group 2C positioned at the left side of the tray group 2D. This sorting of ICs is performed by a carrier arm 11.

Further, the tray group 2B located at the second left side position is an empty tray group located at a buffer section for accommodating trays emptied of ICs in the loader section. When the uppermost tray of any one stack of the tray groups 2C, 2D and 2E in the unloader section is filled with ICs, a tray of this empty tray group 2B is conveyed onto the tray stack of the corresponding tray group and is utilized to store ICs therein.

In the aforementioned IC handler, the subject apparatus or structure to which the present invention is applied is an IC transporting apparatus comprising the contact arm 6 for carrying ICs from the turntable 4 to the testing section 7 and an IC transporting apparatus comprising the carrier arm 11 and the transfer arm 8 for conveying ICs from the testing section 7 to the carrier arm 11.

FIG. 3 shows a structure of a contact chuck portion for picking up ICs out of positioning recessed portions 5 formed on a prior art turntable 4. A reference numeral 12 denotes the entire structure of the contact chuck. The contact chuck 12 comprises a supporting plate 13, guide pins 14 implanted on this supporting plate 13, suction unit 15 for picking up ICs by suction, and a lead pusher (a tool for pressing or pushing lead terminals of an IC) 16 surrounding this suction unit 15.

The suction unit 15 comprises a sucker 15A mounted on the lower or forward end portion of the suction unit 15 and a sucking path 15B for aspirating air through the sucker 15A. The lead pusher 16 is arranged such that the suction unit 15 is positioned in the center of the lead pusher 16 and is surrounded by the lead pusher 16. This lead pusher 16 is adapted to perform operation of defining an IC to a predetermined position so that the suction unit 15 can pick up by suction an IC being accurately located on the predetermined position when the suction unit 15 picks up the IC.

That is, the forward or lower end portion of the lead pusher 16 has a tapered surface so that the lead pusher 16 can get into the positioning recessed portion 5, and the tapered end portion is inserted into the positioning recessed portion 5. By inserting the end portion of the lead pusher 16 into the positioning recessed portion 5, the sucker 15A can approach the IC and come in contact with the IC to pick up the IC by suction. At this time, the lead terminals of the IC are forced to engage with the inner sides of the end portion of the lead pusher 16, and hence the IC is located to a position determined by the lead pusher 16 and then the IC is picked up by suction.

Further, the lead pusher 16 performs operation of pushing the lead terminals of the IC against an IC socket in the state that the IC is conveyed to the testing section 7 and of maintaining the electrical contact between the IC and the IC socket. Therefore, at least a portion of the lead pusher 16 which contacts with the lead terminals is formed of an insulating material. In the illustrated example shown in the drawing, a case is shown where the entire lead pusher is integrally formed of an insulating material by molding.

The contact chuck 12 is supported by a member 17 hanging from the contact arm 6 (not shown in FIG. 3) and is movable in the up-and-down (vertical) direction and in the rotating direction of the contact arm. A shock absorber 18 lies between the member 17 and the contact chuck 12. This shock absorber 18 consists of a plate 18A mounted on the lower side of the member 17, rods 18B hanging from the plate 18A, a plate 18C hanging from the rods 18B and springs 18D each applying a predetermined pressure between the plates 18A and 18C.

Rods 13A stand upwardly on the supporting plate 13 which is a part of the contact chuck 12. The contact chuck 12 hangs from the member 17 through the shock absorber 18 by causing the rods 13A to pass through the plate 18C which is a part of the shock absorber 18 and to engage the rods 13A with the plate 18C.

When the contact chuck 12 moves downwardly and approaches the positioning recessed portion 5, it is necessary to align the central position or axis of the lead pusher 16 with the center or central axis of the positioning recessed portion 5. To this end, in the illustrated prior example, a pair of guide bushes 21 is provided on the turntable 4 for each of the positioning recessed portions 5, and also guide pins 14 which fit in the guide bushes 21 are provided on the supporting plate 13 in such a manner that the guide pins 14 project downwardly from the supporting plate 13 whereby the center of the lead pusher 16 can align with the center of the positioning recessed portion 5 by engaging guide pins 14 with the guide bushes 21.

For this positioning and aligning operation, a play or clearance is provided between each rod 13A and a through-hole through which each rod 13A passes and formed in the plate 18C which is a part of the shock absorber 18 so that the positioning of the contact chuck 12 to each recessed portion 5 is made possible within the range of the play between the rod 13A and the through-hole.

In the prior art apparatus, positioning and alignment of the contact chuck 12 to and with the positioning recessed portion 5 has been made possible by means of the guide bushes 21 and the guide pins 14. Since the two guide bushes 21 must be provided for each positioning recessed portion 5 formed on the surface of the turntable 4 as shown in FIG. 2, many guide bushes are required and hence the cost of such parts is high.

In addition, since a multiple of guide bushes 21 must be provided, even the heat capacity of only the guide bushes 21 becomes large, and thus a heating and heat absorbing or cooling apparatus of large capacity must be provided for heating and cooling the thermostatic chamber 9. Further, because of a large heat capacity required, there is a shortcoming that it takes a considerable time until the temperature within the thermostatic chamber 9 reaches a target temperature and stabilizes to that temperature.

SUMMARY OF THE INVENTION

An object of the present invention is to provide an IC transporting apparatus which does not require a positioning and alignment mechanism comprising guide bushes and guide pins, reduces the heat capacity within the thermostatic chamber, and can be manufactured at low cost.

Another object of the present invention is to provide an IC transporting apparatus which can reliably store the tested ICs in a tray located at the unloader section.

In the present invention, there is provided an IC transporting apparatus wherein a guide surrounding the device suction unit of a device chuck part has the positioning function, too. That is, the forward or lower end (tip) portion of the guide surrounding the device suction unit is formed having a shape which can fit in a positioning recessed portion without any play or clearance therebetween, and also the guide has flat portions each of which engages with or abuts against a corresponding one of the upper end surfaces of the positioning recessed portion.

According to the arrangement of the present invention, when the device suction unit of the device chuck part approaches a positioning recessed portion formed on the turntable or a positioning recessed portion formed on the transfer arm, first, the lower end portion of the guide surrounding the device suction unit starts to engage with the positioning recessed portion and then the guide is guided in the positioning recessed portion by this engagement of the guide with the positioning recessed portion so that the positions of the guide and the recessed portion are aligned to each other.

Next, when the guide is further inserted into the positioning recessed portion, the flat portions formed on the guide abut against the upper end surface of the positioning recessed portion, and hence the guide is inhibited against encroaching into the positioning recessed portion by this engagement of the flat portions of the guide with the upper end surface of the recessed portion. As a result, the guide does not encroach into the positioning recessed portion, and hence the IC located in the recessed portion is protected against breakage or damage by the guide and the positioning and alignment of the guide and the recessed portion can be effected with the same accuracy as that of the prior art apparatus.

DESCRIPTION OF THE PREFERRED EMBODIMENTS

Now, the embodiments of the present invention will be described with reference to the accompanying drawings.

Figure 1:
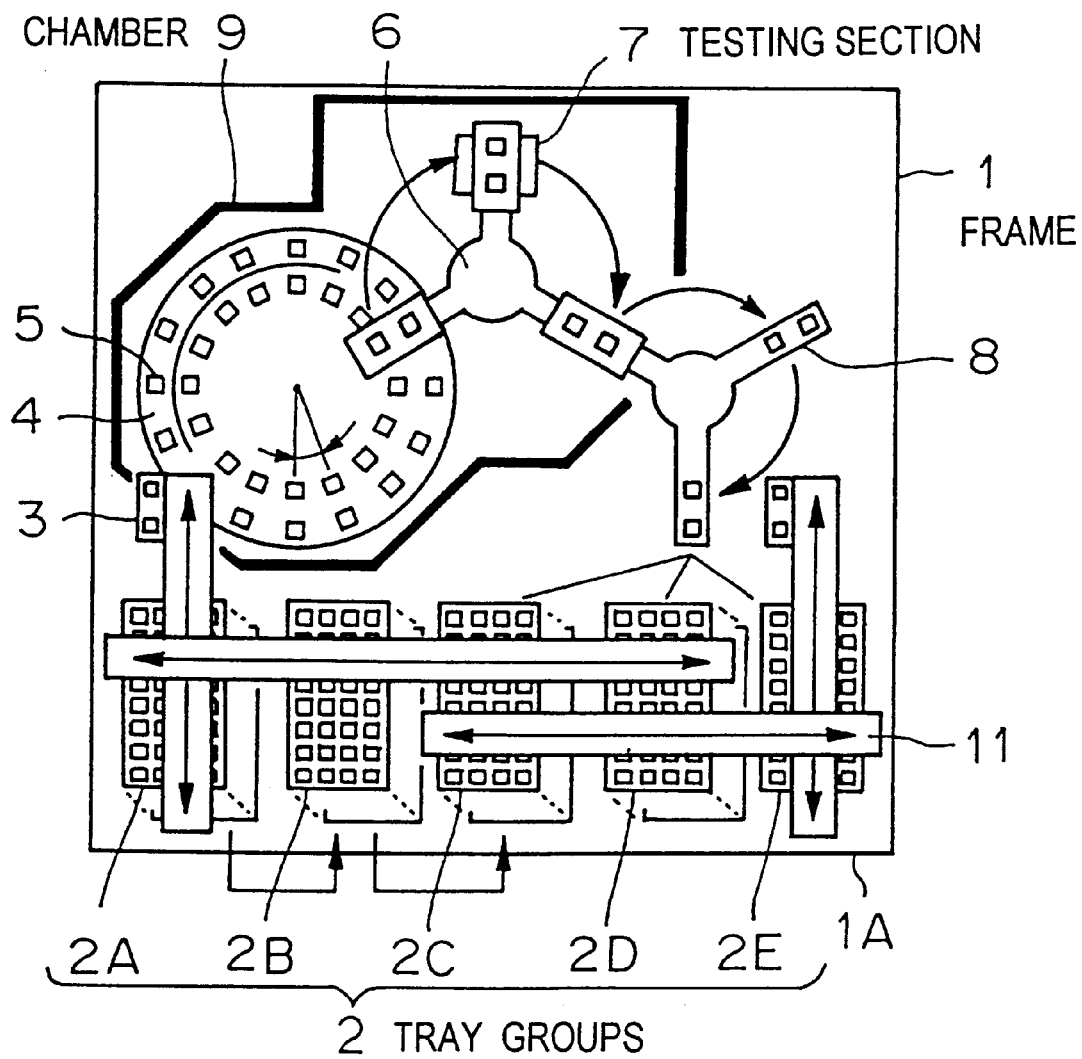
FIG. 1 is a diagrammatic plan view showing an example of an IC handler to which the present invention is applied.
Figure 2:
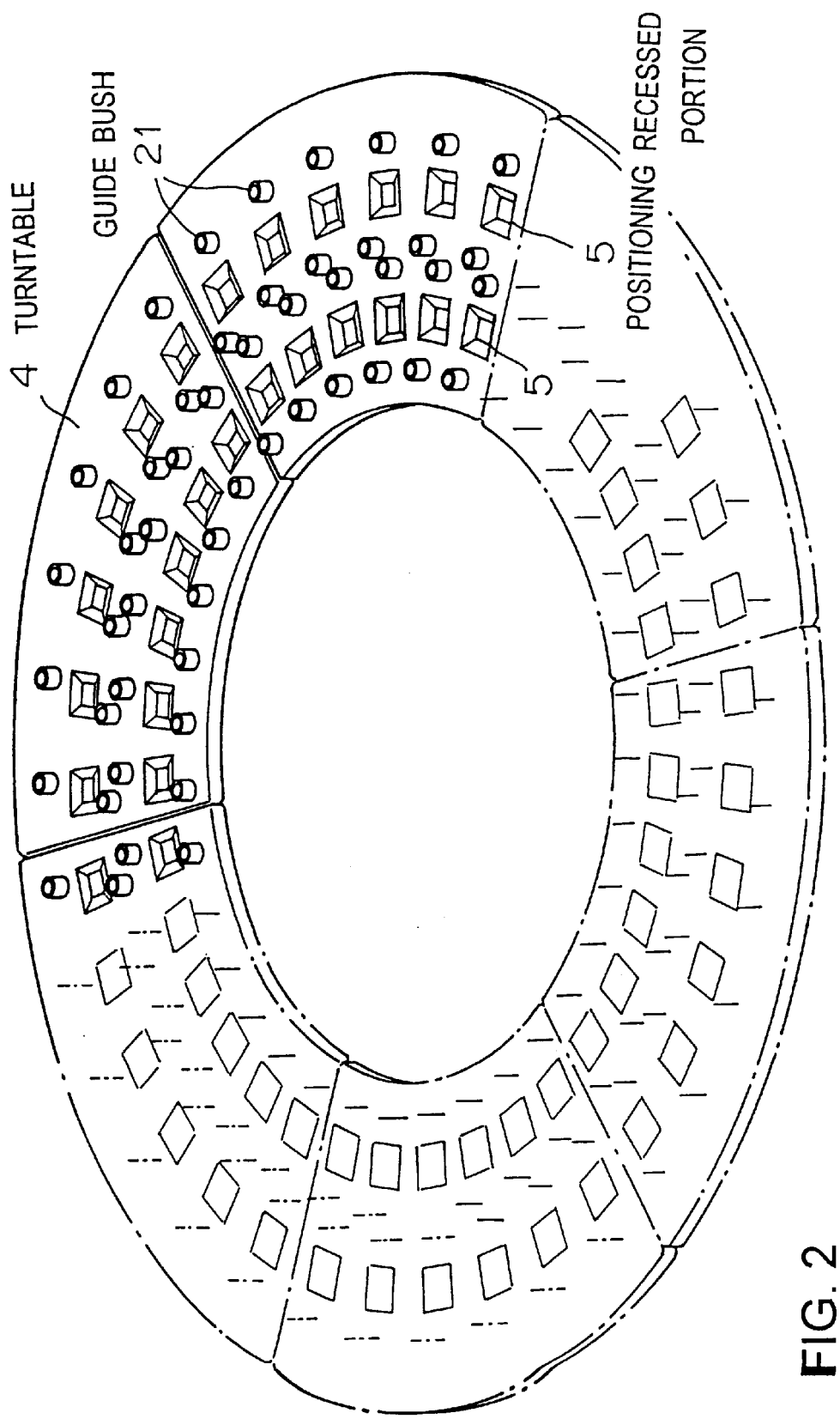
FIG. 2 is a perspective view of a turntable used in a prior art IC handler for explaining the structure thereof.
Figure 3:
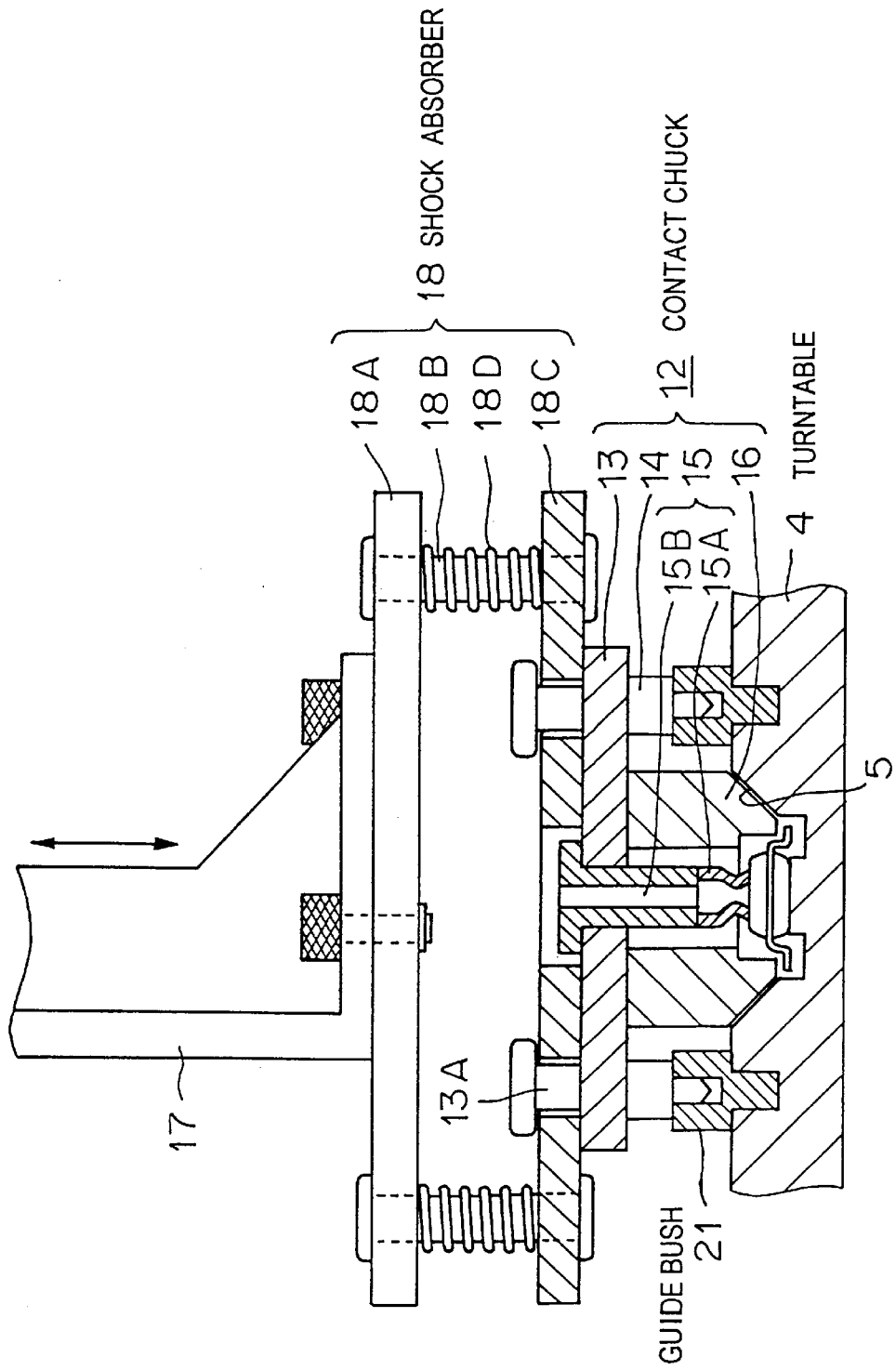
FIG. 3 is a sectional view showing the structure of a prior art IC transporting apparatus.
Figure 4:
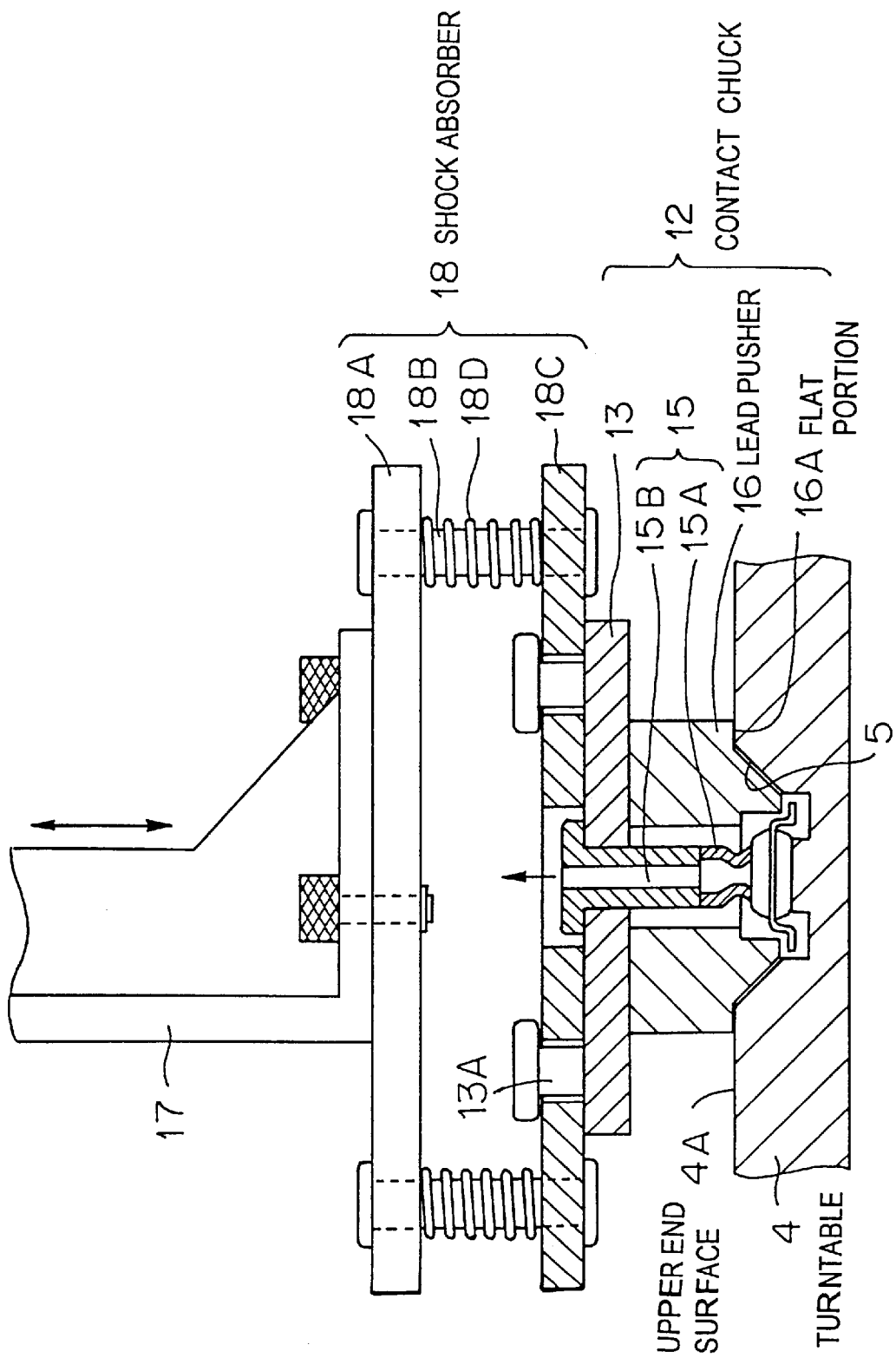
FIG. 4 is a sectional view showing the structure of a first embodiment of an IC transporting apparatus according to the present invention.

FIG. 4 shows a first embodiment of the IC transporting apparatus according to the present invention. In FIG. 4, portions or elements corresponding to those of FIG. 3 are indicated by the same reference numerals or characters as in FIG. 3. This first embodiment shows the case in which the present invention is applied to an apparatus or structure for picking up ICs to be tested by suction out of positioning recessed portions 5 of a turntable 4 by a contact arm 6 and transferring them to the testing section 7 by the contact arm 6.

In this embodiment, a guiding function is given to a lead pusher 16 surrounding a suction unit 15 of a device chuck part, i.e., a contact chuck 12 in this example, and so the forward or lower end portion of the lead pusher 16 is formed having a shape which can fit in each positioning recessed portion 5 without any play or clearance therebetween. That is, in the prior art apparatus, since positioning and alignment of the contact chuck 12 to and with the positioning recessed portion 5 has been made possible by means of the guide bushes 21 and the guide pins 14 as shown in FIG. 3 and, also, the distance or depth of the lead pusher 16 entering into the recessed portion 5 has been confined by means of the guide bushes 21 and the guide pins 14, the lower end portion of the lead pusher 16 has been formed to have a shape which produces a play to some extent between the lead pusher 16 and the positioning recessed portion 5 when lead pusher has engaged with the recessed portion.

However, in the present invention, the lead pusher 16 is also used as a guide and the positioning and alignment of the contact chuck 12 to and with the positioning recessed portion 5 is made possible by this lead pusher 16. Therefore, if there is any play in the engaged state between the lead pusher 16 and the positioning recessed portion 5 or if the lead pusher 16 loosely engages with the recessed portion, the accuracy of the positioning and the alignment is decreased.

For this reason, in this embodiment, the forward end portion of the lead pusher 16 has a shape formed to conform to the inclined surface of the positioning recessed portion 5 so that the forward end portion of the lead pusher 16 can engage with the positioning recessed portion 5 without any play therebetween. In addition, flat portions 16A are formed on the lead pusher 16 at the position thereof spaced apart from the tip end of the lead pusher 16 by a distance corresponding to a predetermined depth which the forward end portion of the pusher 16 enters into the positioning recessed portion 5. These flat portions 16A abut against the upper end surface 4A of the positioning recessed portion 5 in the engaged state.

By the abutment of the flat portions 16A against the upper end surface 4A of the positioning recessed portion 5, the lead pusher 16 is inhibited against further encroaching into the positioning recessed portion 5, and the IC transporting apparatus is provided which prevents causing an accident in which the lead pusher 16 encroaches into the positioning recessed portion 5.

Further, in this embodiment, each of the positioning recessed portions has a play so that a semiconductor device fallen thereinto can move in the horizontal direction to some extent when the lead pusher 16 engages with the positioning recessed portion 5.

Figure 5:
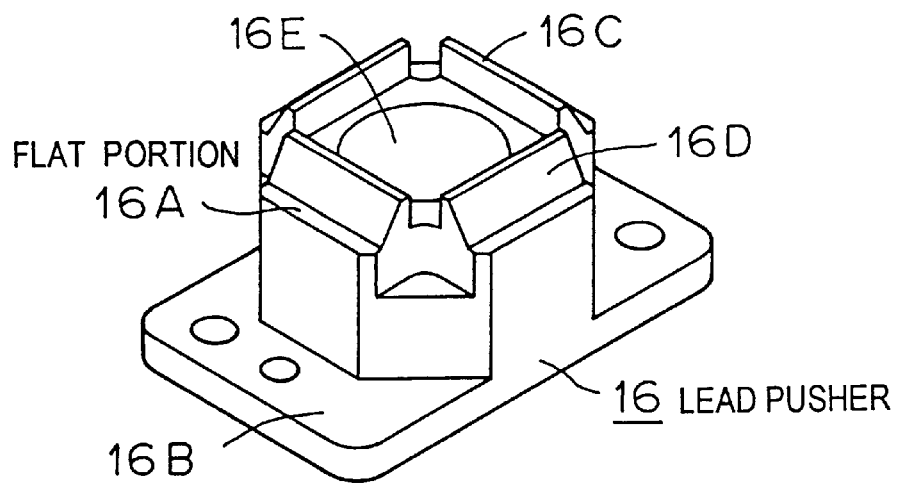
FIG. 5 is a perspective view showing an example of a lead pusher used in the IC transporting apparatus of the present invention.

FIG. 5 shows a structure of the lead pusher 16 used in the present invention. Since the lead pusher 16 used in the present invention performs repetitive operations of engagement with and release from the positioning recessed portions 5, the lead pusher 16 is formed of a reinforced plastic material having both sliding and wear resisting (durable) features.

In FIG. 5, the lead pusher 16 is shown bottom up (upside down). Reference character 16B denotes a flange portion which is adapted to be mounted to the supporting plate 13 and reference character 16C denotes downwardly projected ridges of the forward end portion which gets into the positioning recessed portion 5. The ridges 16C are provided along every sides of a regular square and the slope of the inclined surface 16D of each ridge conforms to the angle of corresponding one of the inclined surfaces of the positioning recessed portion 5. The flat portions 16A are formed at the lower ends of the inclined surfaces 16D (seeing in the state of FIG. 5), respectively. A through-hole 16E through which the suction unit 15 passes is formed at the center of the regular square along each side of which the ridge 16C is disposed.

Figure 6:
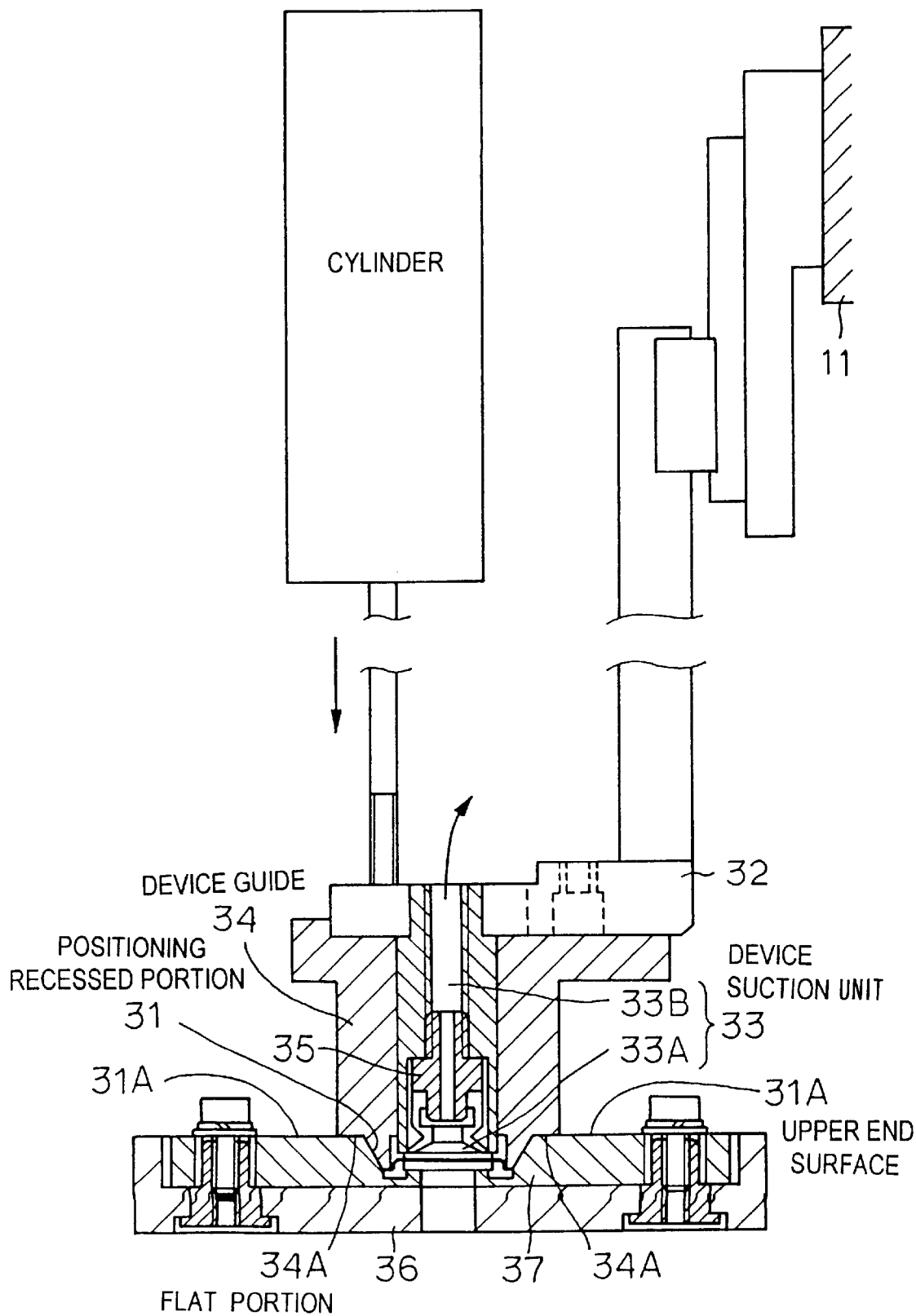
FIG. 6 is a sectional view showing the structure of a second embodiment of the IC transporting apparatus according to the present invention.

FIG. 6 shows a second embodiment of an IC transporting apparatus according to the present invention. This embodiment shows the case where the present invention is applied to an apparatus or structure for picking up the tested ICs by suction out of positioning recessed portions 31 provided on the upper surface of the transfer arm 8 by a device suction unit (chuck) 33 of a device chuck part 32 of the carrier arm 11 and conveying the ICs to a tray located at the unloader section by the carrier arm 11.

Figure 7:
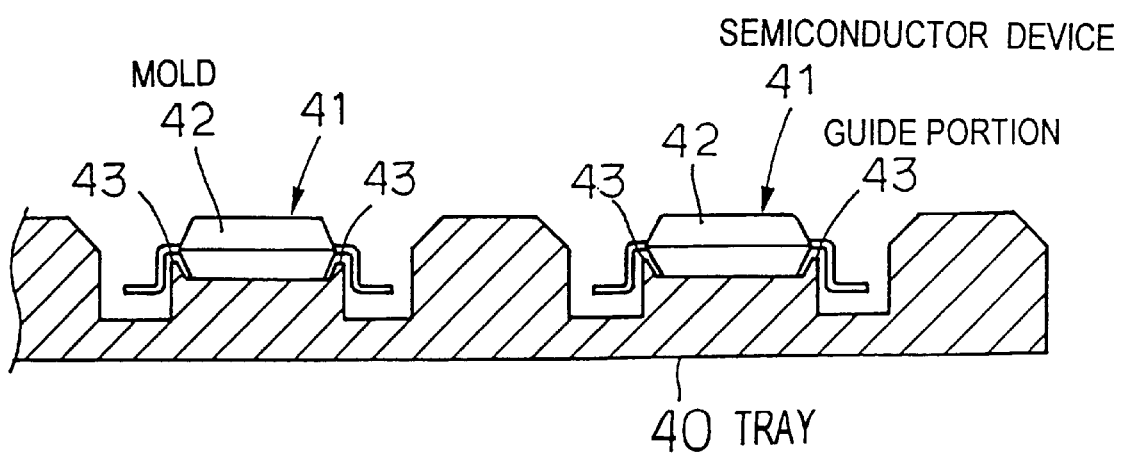
FIG. 7 is a sectional view showing a tray of type for guiding IC packages and the ICs loaded on the tray.

As an example of a recent tray 40 is shown in FIG. 7, in recent years there are increased trays of a type having frame-like guide portions 43 each for guiding the mold (package) 42 of a semiconductor device (an IC in this example) 41. To this end, a severe accuracy for positioning an IC in the tray 40 has been requested.

In the prior art apparatus, for example, if the transfer arm 8 stops at a position shifted by a little from the normal position, the interval or space between the ICs loaded in the two positioning recessed portions formed on the upper surface of the transfer arm 8 becomes smaller or larger than the normal interval. Since the carrier arm 11 picks up by suction and holds the two ICs as they are, the two ICs are transferred to the tray with the two ICs held in the state of the abnormal interval.

As a result, the prior art apparatus has a shortcoming that the two ICs cannot be stored successfully in the tray at the normal accurate positions. Particularly, in case of the tray 40 of such mold guide type as shown in FIG. 7, accidents have occurred in which the ICs stored in the tray have ridden over the guide portions 43 and have fallen from the normal storing positions.

In this embodiment, like the case of the lead pusher 16 of the first embodiment, the lower end portion of the device guide 34 surrounding the device suction unit 33 mounted on the end portion of the device chuck part 32 of the carrier arm 11 is formed having a shape which engages with the positioning recessed portion 31 of the transfer arm 8 without any play therebetween.

That is, in the prior art apparatus, since positioning and alignment of the device guide 34 to and with the positioning recessed portion 31 has been made possible by means of the guide bushes 21 and the guide pins 14 as shown in the prior case shown in FIG. 3, and also the distance or depth of the lower end portion of the device guide 34 entering into the recessed portion 31 has been confined by means of the guide bushes and the guide pins, the device guide 34 of the prior art apparatus has been formed to have a shape which produces a play to some extent between the tip portion of the device guide 34 and the positioning recessed portion 31 when the device guide has engaged with the recessed portion.

However, in the present invention, the positioning and alignment of the device guide 34 to and with the positioning recessed portion 31 is made possible by this device guide 34. Therefore, if there is any play in the engaged state between the forward end portion of the device guide 34 and the positioning recessed portion 31 or if the forward end portion of the device guide 34 loosely engages with the recessed portion 31, the accuracy of the positioning and alignment is decreased.

For this reason, in this embodiment of the present invention, the forward end portion of the device guide 34 is also formed to have a shape which conforms to the inclined surfaces of the positioning recessed portion 31 so that the forward end portion of the device guide 34 can engage with the positioning recessed portion 31 without any play therebetween. In addition, flat portions 34A are formed on the device guide 34 at the position thereof spaced apart from the tip end of the device guide 34 by a distance corresponding to a predetermined depth which the lower end portion of the device guide 34 enters into the positioning recessed portion 31. This flat portions 34A abut against the upper end surface 31A of the positioning recessed portion 31 in the engaged state.

By the abutment of the flat portions 34A against the upper end surface 31A of the positioning recessed portion 31, the device guide 34 is inhibited against further encroachment into the positioning recessed portion 31, and thus the IC transporting apparatus is provided which prevents causing an accident in which the device guide 34 encroaches into the positioning recessed portion 31, and allows the position at which the device guide 34 picks up an IC by suction can be determined with high accuracy.

Further, in this second embodiment, each of the positioning recessed portions 31 also has a play so that a semiconductor device fallen thereinto can move in the horizontal direction to some extent when the device guide 34 engages with the positioning recessed portion 31.

The device guide 34 having similar shape and structure to the lead pusher 16 shown in FIG. 5 and used in the first embodiment can be used. The device suction unit 33 comprises of a sucker 33A for picking up an IC by suction and a sucking path 33B. The sucker 33A is fixed to the lower end of a cylindrical slidable member 35 which is adapted to be able to slide in the vertical direction in the drawing within the device guide 34. The positioning recessed portion 31 is formed on an unit member 37 slidably mounted on a base member 36 which is fixed to the transfer arm 8.

In particular, the unit member 37 has, in this example, two positioning recessed portions previously formed thereon and is referred to as a recessed portion unit. This recessed portion unit 37 is mounted to the base member 36 so as to be slidable in the horizontal direction in the drawing to some extent so that an IC fallen into the recessed portion 31 can be movable to some extent in the horizontal direction due to the sliding of the recessed portion unit 37. Therefore, even if the transfer arm 8 stops at a position shifted by a small amount from the normal position and the interval between the ICs held by the transfer arm 8 becomes shorter than the normal interval, the carrier arm 11 picks up and holds the two ICs by suction in a state such that the interval between the two ICs is normal because the recessed portion unit 37 slides relative to the base member 36 because the two device guides 34 (only one of them is shown in FIG. 6) enter into and fit in the corresponding positioning recessed portions 31 (only one of them is shown in FIG. 6).

As a result, the two ICs are transferred to the tray by the carrier arm 11 with a normal interval between the ICs, and the two ICs are stored successfully in the tray at normal accurate positions.

Since the IC handler to which the present invention is applied is constructed such that two ICs are transported and tested at a time, two positioning recessed portions 31 are formed on the recessed portion unit 37. However, the number of positioning recessed portions 31 formed on the recessed portion unit 37 is changed depending on the kind of the IC handler.

Further, the present invention can also be applied to other portions of the IC transporting apparatus having similar semiconductor device positioning recessed portions and device suction parts.

As is apparent from the foregoing, the IC transporting apparatus according to the present invention is constructed such that a guide surrounding device suction unit of a device chuck part such as the lead pusher 16 or the device guide 34 is engaged with a positioning recessed portion to align the position of the chuck part with the position of the positioning recessed portion. Therefore the IC transporting apparatus of the present invention can always pick up a semiconductor device by suction at an accurate position. Consequently, even in case of transporting a plurality of semiconductor devices, no positional discrepancy occurs therebetween.

In addition, since there is no need for providing any guiding and engaging means such as the guide bushes around each positioning recessed portion, the number of parts can be reduced and thus the cost can be reduced. Further, since the heat capacity within the thermostatic chamber can be reduced, the time required to stabilize the temperature in the chamber to a predetermined target temperature can be shortened. Furthermore, there is an advantage that the capacity or power of the heating and heat sinking (cooling) apparatus for controlling the temperature in the chamber can also be reduced.

What is claimed is:

1. A semiconductor device transporting apparatus comprising:

device carrying means provided in an upper surface thereof with a positioning recess which includes upwardly inclined surfaces for retaining therein a semiconductor device; and device chuck means including:

device suction means for picking up by suction the semiconductor device retained in said positioning recess, and guide means surrounding said device suction means for guiding said device suction means to align with said positioning recess, said guide means having flat surface portions and downwardly projected portions each extending downward from the flat surface portions of the guide means, each of the downwardly projected portions of said guide means being provided thereon with a downwardly inclined surface which is formed to conform to a corresponding one of the upwardly inclined surfaces of said positioning recess, respectively, so that the projected portions of said guide means engage with the upwardly inclined surfaces of said positioning recess without a substantial marginal space therebetween, and said flat portions of said guide means being formed to engage with the upper surface of said device carrying means without a substantial marginal space therebetween when the downwardly inclined surface of the projected portions of said guide means engage with the upwardly inclined surfaces of said positioning recess without a substantial marginal space therebetween.

2. The semiconductor device transporting apparatus according to claim 1, wherein said device carrying means is a turntable having said positioning recess in the upper surface thereof for retaining therein the semiconductor device to be tested, and said guide means surrounding said device suction means is a lead pusher operatively pressing lead terminals of the semiconductor device against a socket so that the lead terminals are brought into electrical contact with the socket during testing.

3. The semiconductor device transporting apparatus according to claim 1, wherein said device carrying means is a transfer arm for transferring a tested semiconductor device to a carrier arm, and said guide means surrounding said device suction means is a device guide surrounding device suction means of the carrier arm, said device guide of said carrier arm being adapted to align said device suction means of said carrier arm with the positioning recess of said transfer arm.

4. The semiconductor device transporting apparatus according to claim 1, wherein said positioning recess includes a play allowing the semiconductor device fallen into said positioning recess to make a slight move in a horizontal direction in said recess.

5. An integrated circuit transporting apparatus comprising:
a device chuck comprising:
a device suction unit, and
a guide surrounding the device suction unit and having flat portions and projected portions extending from the flat portions; and
a device carrier having an upper end surface and a positioning recess in said upper end surface for retaining therein an integrated circuit to be transported,
each of said projected portions of said guide having a downwardly inclined surface,
the positioning recess having upwardly inclined surfaces which are conformed to the downwardly inclined surfaces of the projected portions corresponding to each other,
wherein said downwardly inclined surfaces of the projected portions abut the corresponding upwardly inclined surfaces of the positioning recess without a substantial marginal space therebetween to guide the device suction unit to be aligned with the positioning recess, and the flat portions of said guide abut the upper end surface of the positioning recess without a substantial marginal space therebetween to prevent the projected portion from over engagement within the positioning recess.

6. The integrated circuit transporting apparatus according to claim 5, wherein the projected portions abut the positioning recess flushly, while the flat portions abut the upper end surfaces flushly.

7. A semiconductor device transporting apparatus comprising:
a device carrier comprising:
an upper end surface, and
at least one positioning recess formed in the upper end surface for retaining a semiconductor device and positioned at a first location, said positioning recess including:
a bottom portion; and
upwardly inclined surface portions each extending from the bottom portion to the upper end surface;
a device chuck comprising:
a device suction unit picking up the semiconductor device, and
guide members surrounding the device suction unit, each including a flat surface portion and a downwardly inclined projecting portion extending from the flat surface portion, said downwardly inclined projecting portions being so formed as to conform with the upwardly inclined surface portions of said one positioning recess, and said flat surface portion being so formed as to conform with the upper end surface of the device carrier;
control means for controlling said device chuck, said control means comprising:
means for moving said device chuck downwardly toward one of the at least one positioning recesses of said device carrier positioned at the first location, so that the downwardly inclined portions of the guide member engage with the upwardly inclined surface portions of said one positioning recess to thereby guide the device suction unit in alignment with said one positioning recess, while the flat surface portion of said guide member engages to the upper end surface of said device carrier to thereby prevent said projecting portions of said guide member from excessively engaging into said positioning recess,
means for activating said device suction unit to pick up a semiconductor device in said one positioning recess by air suction when the device suction unit comes into alignment with said one positioning recess at the first location, and
means for transporting said device chuck having the semiconductor device thus picked-up from the first location to a second location.

8. The semiconductor device transporting apparatus according to claim 7, wherein said device carrier comprises a turntable having said positioning recess in the upper surface thereof retaining therein the semiconductor device to be tested and said second location comprises a testing section where said semiconductor is subjected to test.

9. The semiconductor device transporting apparatus according to claim 8, wherein said guide members surrounding said device suction means comprises lead pushers operatively pressing lead terminals of the semiconductor device against a socket positioned at the second location so that the lead terminals are brought into electrical contact with the socket during testing.

10. The semiconductor device transporting apparatus according to claim 7, wherein said device carrier comprises a transfer arm transferring a tested semiconductor device out of a testing section, and said guide members comprise device guides surrounding a device suction means mounted to a carrier arm, said device guides of said carrier arm being adapted to guide said device suction means of said carrier arm to be aligned with the positioning recess of said transfer arm.

11. The semiconductor device transporting apparatus according to claim 10, wherein said second location comprises a tray section where said semiconductor is to be stored.

12. The semiconductor device transporting apparatus according to claim 10, wherein said tray section includes a plurality of trays each including semiconductor device receiving recesses, and said device guides of the carrier arm act to guide the device suction means carrying the picked-up tested semiconductor device to one of the receiving recesses of one tray positioned at the second location.

13. The semiconductor device transporting apparatus according to claim 7, wherein said device carrier includes a base member and a sub base member mounted to said base member movable within a marginal space in a horizontal direction with respect to said base member, and said sub base member includes at least one positioning recess device with which said guide members are engaged, so that said device suction means is aligned with said one positioning recess of the sub base member within said marginal space.

14. A semiconductor device transporting apparatus comprising:
a device carrier including an upper end surface and at least one positioning recess formed in the upper end surface for retaining therein a semiconductor device, said positioning recess including a bottom portion and upwardly inclined surface portions each extending from the bottom portion to the upper end surface; and
a device chuck operatively transported from a first location to a second location and including a suction unit and a plurality of guide members surrounding said suction unit, each of said guide members including a flat surface portion and downwardly inclined projecting portion extending from the flat surface portion, said downwardly inclined projecting portions being formed to conform with the upwardly inclined surface portions of said one positioning recess, respectively, said flat surface portion being formed to conform with the upper end surface of the device carrier, respective of said downwardly inclined portions of the guide members operatively engaging with the respective upwardly inclined surface portions of said one positioning recess when said guide members are moved downwardly to abut against said one positioning recess to thereby guide said device suction unit in alignment with said one positioning recess, consequently said flat surface portion of each said guide member operatively engaging with the upper end surface of said device carrier to thereby prevent said projecting portions of said guide members from excessively engaging into said positioning recess, and said suction unit being operatively capable of picking up a semiconductor device to be transported at the first location and capable of releasing the thus picked-up semiconductor device at the second location.

15. The semiconductor device transporting apparatus according to claim 14, wherein said one positioning recess of said device carrier includes therein a semiconductor device to be transported and positioned at the first location, so that said suction unit operatively picking up the semiconductor unit when said suction unit is aligned with the one positioning recess at the first location.

16. The semiconductor device transporting apparatus according to claim 14, wherein said one positioning recess of said device carrier is positioned at the second location, and said suction unit including picked up at the first location a semiconductor device to be transported is guided by the guide members to be aligned with said one positioning recess, so that the semiconductor device thus picked-up is released into said one positioning recess.

17. The semiconductor device transporting apparatus according to claim 14, which further comprises:
   a chuck carrier member to which said device chuck is mounted for transporting said device chuck from the first location to the second location; and
   means for activating said device suction unit to pick up the semiconductor device by air suction when the device suction unit comes in alignment with said one positioning recess.

18. A semiconductor device transporting apparatus comprising:
   a suction pick-up head picking up a semiconductor device from a semiconductor device carrier;
   a positioning recess formed in the semiconductor device carrier, said positioning recess including upwardly and outwardly inclined wall faces;
   suction means in the suction pick-up head for picking up by suction the semiconductor device located in the positioning recess; and
   guide means surrounding the suction means for guiding the suction means such that the suction means is enabled to pick up the semiconductor device by suction at a predetermined position, said guide means including downwardly projecting ridged portions at a lower end portion thereof;
   wherein each of said ridged portions of the guide means includes a shape substantially complementary to corresponding one of the inclined wall faces of the positioning recess; and
   wherein the guide means includes flat stop faces at bases of the ridged portions such that the stop faces abut against upper end face portions of said semiconductor device carrier surrounding the positioning recess, when the ridged portions of the guide means are engaged with the inclined wall faces of the positioning recess without any play therebetween.

19. The semiconductor device transporting apparatus according to claim 18, wherein said positioning recess is dimensioned such that the semiconductor device accommodation therein can slightly move in a horizontal direction.

20. The apparatus according to claim 18, wherein said semiconductor device carrier comprises a turn table supplying semiconductor devices to be tested to said suction means, and said guide means comprises a lead pusher which serves to press lead terminals of a semiconductor device against contacts of a socket for obtaining a electrical contact on testing.

21. The apparatus according to claim 18, wherein said semiconductor device carrier comprises a transfer arm transferring a tested semiconductor device, and said guide means comprises a guide supporting the suction means of a carrier arm adapted to load the semiconductor device transferred by sid transfer arm on a predetermined tray.

22. A semiconductor device transporting apparatus comprising:
   a device carrier including an upper end surface and positioning recessed portions formed in the upper end surface, each of the positioning recessed portions including a bottom surface portion on which a semiconductor device is placed and upwardly inclined surface portions each extending from the bottom surface to reach the upper end surface;
   a contact chuck including:
      a device suction unit picking up the semiconductor device placed in one of the positioning recessed portions of said device carrier lying underneath the device suction unit, and
      a guide member surrounding the device suction unit and including a flat surface portion, and projected portions extending from the flat surface portion, wherein the projected portions include downwardly inclined surface portions each extending from the flat surface portion and wherein the downwardly inclined surface portions are so formed to abut the upwardly inclined portions while the flat surface portion abuts the upper end surface of the device carrier;
   means for moving said device chuck toward one of the positioning recessed portions of said device carrier so that the downwardly inclined portions of the guide member engage the upwardly inclined surface portions of said one of the positioning recessed portions to thereby guide the device suction unit in conformity with said one positioning recessed portion without using any other positioning and alignment mechanism;
   means for activating said device suction unit to pick up the semiconductor device by air suction when the device suction unit comes at a position in conformity with the semiconductor device in said one positioning recessed portion;
   said means for moving operatingly releasing said device chuck from abutment with the device carrier after activation by the activating means; and
   a transporting member, to which said device chuck is secured, carrying said device chuck from the position where the device chuck overlies said one positioning recessed portion toward a designate section.

23. A semiconductor device transporting apparatus comprising:

(a) a device carrier comprising an upper end surface and positioning recesses formed in said upper end surface, wherein each of the positioning recesses includes a bottom portion and upwardly inclined surface portions each extending from the bottom portion to the upper end surface;

(b) a transporting member including a device chuck mounted thereto for locating said device chuck at a first location wherein one of said positioning recesses of said device carrier is positioned, and for transporting said device chuck from the first location to a second location, wherein said device chuck includes a device suction unit capable of picking up a semiconductor device to be transported by air suction and a guide member surrounding said device suction unit and including a flat surface portion and downwardly inclined projecting portions extending from the flat surface portion, and wherein said downwardly inclined projecting portions includes a shape substantially complementary to corresponding one of the upwardly inclined portions of said one of the positioning recesses, respectively, while the flat surface portion includes a shape substantially complementary to the upper end surface of said device carrier;

(c) moving means capable of upwardly and downwardly moving said device chuck from said transporting member for downwardly moving said guide member toward said one of the positioning recesses retaining therein a semiconductor devices to be transported at the first location, so that the downwardly inclined projecting portions of the guide member engage with the upwardly inclined surface portions of said one of the positioning recesses to thereby guide the device suction unit to be aligned with said one positioning recess without using any other positioning and alignment guide mechanism, while the flat surface portion of said guide member engage to the upper end surface of said device carrier; and (d) means for activating said device suction unit to pick up a semiconductor device retained in said one recess by air suction at the first location, so that the semiconductor device thus picked-up is removed from said one recess upwardly due to upward movement of said device chuck and transported to the second location by said transporting member.

\* \* \* \* \*